(12) United States Patent
Lee et al.

(10) Patent No.: US 9,257,447 B2
(45) Date of Patent: Feb. 9, 2016

(54) SEMICONDUCTOR DEVICE AND METHOD OF MANUFACTURING THE SAME

(71) Applicant: SK hynix Inc., Gyeonggi-do (KR)

(72) Inventors: Ki Hong Lee, Gyeonggi-do (KR); Seung Ho Pyi, Gyeonggi-do (KR); In Su Park, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/498,484

(22) Filed: Sep. 26, 2014

(65) Prior Publication Data

US 2015/0050790 A1 Feb. 19, 2015

Related U.S. Application Data

(62) Division of application No. 13/598,414, filed on Aug. 29, 2012, now Pat. No. 8,872,254.

(30) Foreign Application Priority Data

Oct. 5, 2011 (KR) .................. 10-2011-0101388

(51) Int. Cl.
| | |
|---|---|
| *H01L 21/336* | (2006.01) |
| *H01L 27/115* | (2006.01) |
| *H01L 21/02* | (2006.01) |
| *H01L 21/311* | (2006.01) |
| *H01L 21/3213* | (2006.01) |
| *H01L 29/423* | (2006.01) |
| *H01L 29/66* | (2006.01) |

(52) U.S. Cl.
CPC ...... *H01L 27/11582* (2013.01); *H01L 21/0217* (2013.01); *H01L 21/31111* (2013.01); *H01L 21/32133* (2013.01); *H01L 29/4234* (2013.01); *H01L 29/66666* (2013.01); *H01L 29/66833* (2013.01)

(58) Field of Classification Search
CPC ............... H01L 27/11582; H01L 29/66666; H01L 29/66833; H01L 29/4234; H01L 21/0217
See application file for complete search history.

(56) References Cited

U.S. PATENT DOCUMENTS

| | | | | |
|---|---|---|---|---|
| 2009/0032861 A1* | 2/2009 | Dong et al. | ................... | 257/324 |
| 2009/0242966 A1* | 10/2009 | Son et al. | ...................... | 257/324 |
| 2011/0207287 A1* | 8/2011 | Lee et al. | ...................... | 438/424 |
| 2011/0310670 A1* | 12/2011 | Shim et al. | ............... | 365/185.17 |
| 2012/0049268 A1* | 3/2012 | Chang et al. | .................. | 257/324 |
| 2012/0267702 A1* | 10/2012 | Jee et al. | ...................... | 257/324 |
| 2013/0009235 A1* | 1/2013 | Yoo | .............................. | 257/329 |

* cited by examiner

*Primary Examiner* — A. Sefer
(74) *Attorney, Agent, or Firm* — IP & T Group LLP

(57) ABSTRACT

A semiconductor device includes word lines and interlayer insulating layers alternately stacked, a channel layer penetrating the word lines and the interlayer insulating layers, a tunnel insulating layer surrounding the channel layer, and first charge trap layers surrounding the tunnel insulating layer, interposed between the word lines and the tunnel insulating layer, respectively, and doped with first impurities.

20 Claims, 10 Drawing Sheets

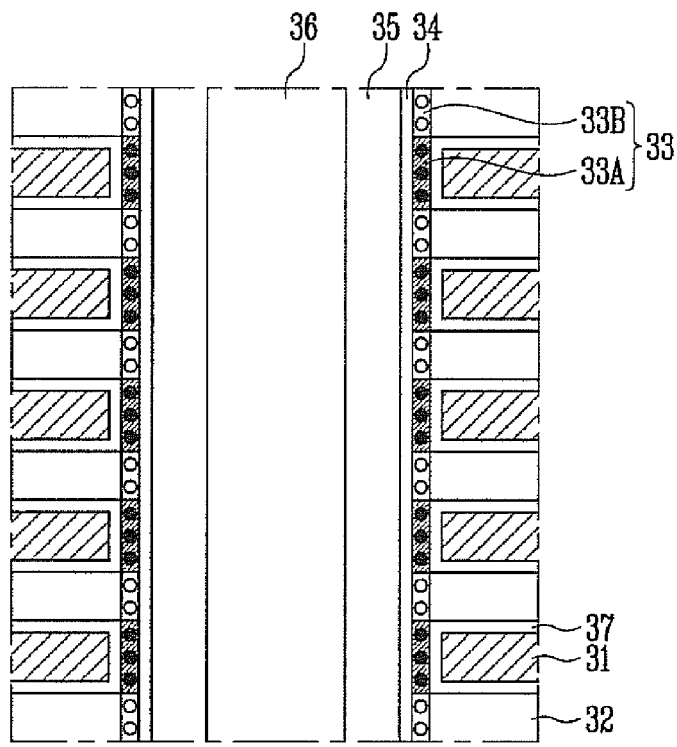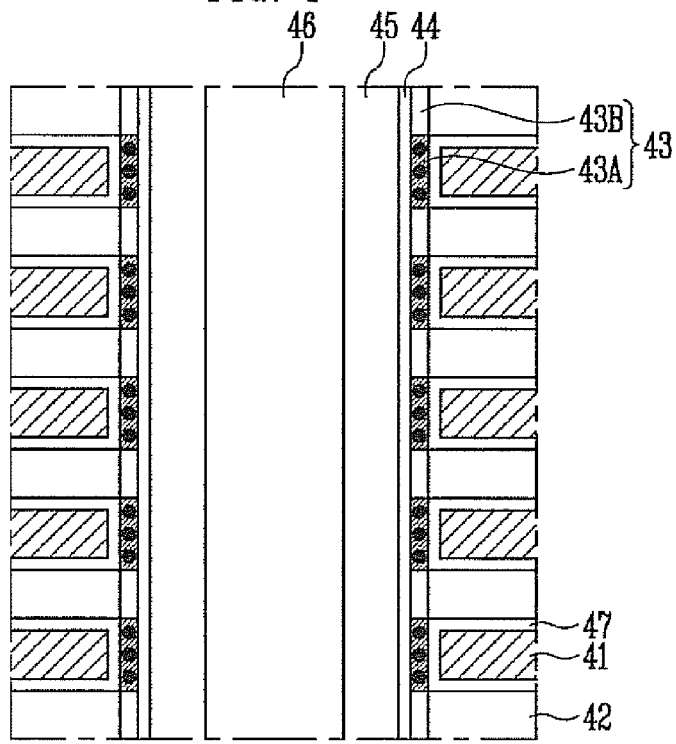

SEMICONDUCTOR DEVICE AND METHOD OF MANUFACTURING THE SAME

CROSS-REFERENCE TO RELATED APPLICATION

Priority to Korean patent application number 10-2011-0101388 filed on Oct. 5, 2011, the entire disclosure of which is incorporated by reference herein, is claimed.

BACKGROUND

Embodiments of the present invention relate to a semiconductor device and a method of manufacturing the same and, more particularly, to a three-dimensionally (3-D) structured nonvolatile memory device and a method of manufacturing the same.

A nonvolatile memory device retains stored data although the supply of power is blocked. As 2-D structured memory devices including memory cells fabricated in a single layer on a silicon substrate reach the limit in increasing the integration degree thereof, there is proposed a 3-D structured nonvolatile memory device in which memory cells are vertically stacked on a silicon substrate.

The structure and features of a conventional 3-D nonvolatile memory device are described below with reference to FIG. 1.

FIG. 1 is a cross-sectional view illustrating the structure of a conventional 3-D nonvolatile memory device.

As shown in FIG. 1, the conventional 3-D nonvolatile memory device includes channels CH protruding from a substrate 10 and a plurality of memory cells MC vertically stacked along the channels CH. The memory device further includes a lower selection gate LSG formed under the plurality of memory cells MC and an upper selection gate USG formed over the plurality of memory cells MC. Bit lines BL are provided over the upper selection gate USG and coupled to the channels CH. In this structure, a plurality of memory cells MC coupled in series between the lower selection gate LSG and the upper selection gate USG form one a cell string STRING, and the cell strings STRING are arranged on the substrate 10.

In FIG. 1, reference numerals 11, 14, and 17 denote interlayer insulating layers, reference numeral 12 denotes a lower selection line, reference numerals 15 denote word lines, and reference numeral 18 denotes an upper selection line. Furthermore, reference numerals 13 and 19 denote gate insulating layers, reference numeral 16 denotes a charge blocking layer, a charge trap layer, and a tunnel insulating layer.

A method of forming the memory cells MC is described below in short. First, after alternately forming a plurality of conductive layers and a plurality of interlayer insulating layers, trenches are formed by etching the plurality of conductive layers and the plurality of interlayer insulating layers. After forming the charge blocking layer, the charge trap layer, and the tunnel insulating layer 16 on the inner walls of the trenches, a channel layer is filled within the trenches. In this manufacture process, the charge trap layers of the plurality of memory cells MC stacked along each of the channels CH are coupled.

Here, the charge trap layer functions as a substantial data depository for storing data through the injection or discharge of electric charges into or from the data depository. Accordingly, in the conventional structure in which the charge trap layers of the memory cells MC are coupled, data stored in memory cells MC may be lost because electric charges stored in one memory cell MC move to another memory cell MC.

For example, if the charge trap layer is formed of a Si-rich nitride layer, stored data may be lost because electric charges stored in the charge trap layer move. In order to prevent the stored data from being lost, the charge trap layer may be made of stoichiometric nitride. If the charge trap layer is made of stoichiometric nitride, however, an erase operation speed may be slow.

BRIEF SUMMARY

An exemplary embodiment of the present invention relates to a semiconductor device having an improved erase characteristic and a method of manufacturing the same.

In an embodiment of the present invention, a semiconductor device includes word lines and interlayer insulating layers alternately stacked, a channel layer penetrating the word lines and the interlayer insulating layers, a tunnel insulating layer surrounding the channel layer, and first charge trap layers surrounding the tunnel insulating layer, interposed between the word lines and the tunnel insulating layer, respectively, and doped with first impurities.

In another embodiment of the present invention, a method of manufacturing a semiconductor device includes alternately forming first material layers and second material layers, forming at least one channel layer penetrating the first material layers and the second material layers, and a charge trap layer surrounding the channel layer, forming a slit exposing the first material layers by etching the first material layers and the second material layers, removing the first material layers exposed by the slits, injecting first impurities into the charge trap layer exposed by removing the first material layers, and forming interlayer insulating layers or word lines in regions from which the first material layers are removed.

In yet another embodiment of the present invention, a method of manufacturing a semiconductor device includes alternately forming conductive layers and sacrificial layers, forming at least one channel layer penetrating the conductive layers and the sacrificial layers, a charge trap layer surrounding the channel layer and doped with first impurities, and a charge blocking layer surrounding the charge trap layer, forming a slit exposing the sacrificial layers by etching the conductive layers and the sacrificial layers, removing the sacrificial layers exposed by the slits, etching the charge blocking layer exposed by removing the sacrificial layers, removing the charge trap layer exposed by etching the charge blocking layer, and forming an interlayer insulating layer in regions from which the sacrificial layers, the charge blocking layer, and the charge trap layer are removed.

BRIEF DESCRIPTION OF THE DRAWINGS

FIG. 3 is a cross-sectional view illustrating the structure of a semiconductor device according to a second embodiment of the present invention;

FIG. 4 is a cross-sectional view illustrating the structure of a semiconductor device according to a third embodiment of the present invention;

DESCRIPTION OF EMBODIMENTS

Hereinafter, some exemplary embodiments of the present disclosure will be described in detail with reference to the accompanying drawings. The figures are provided to enable those of ordinary skill in the art to make and use the present invention according to the exemplary embodiments of the present invention.

Figure 1:
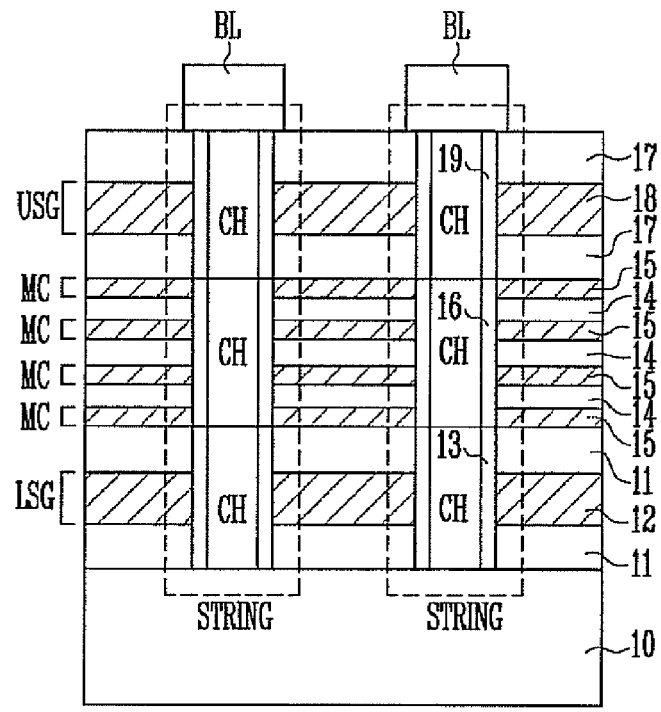
FIG. 1 is a cross-sectional view illustrating the structure of a conventional 3-D nonvolatile memory device.
Figure 2:
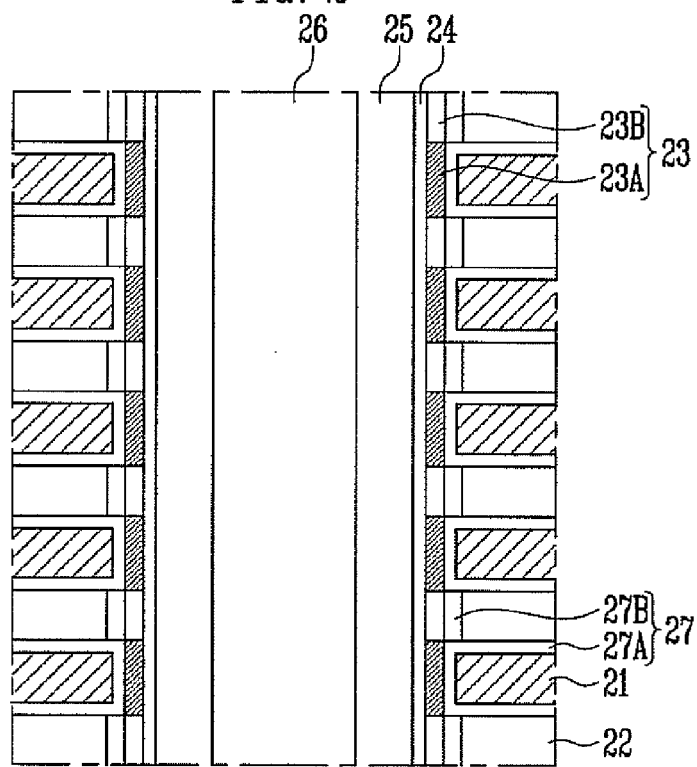
FIG. 2 is a cross-sectional view illustrating the structure of a semiconductor device according to a first embodiment of the present invention.

FIG. 2 is a cross-sectional view illustrating the structure of a semiconductor device according to a first embodiment of the present invention. In FIG. 2, a region where memory cells are formed is enlarged and illustrated, for description purposes.

As shown in FIG. 2, the semiconductor device according to the first embodiment of the present invention includes a plurality of word lines 21 and a plurality of interlayer insulating layers 22 alternately stacked, a channel layer 25 penetrating the plurality of word lines 21 and the plurality of interlayer insulating layers 22, a tunnel insulating layer 24 surrounding the channel layer 25, and first charge trap layers 23A surrounding the tunnel insulating layer 24 and interposed between the plurality of word lines 21 and the tunnel insulating layer 24.

The first charge trap layers 23A include impurities. The impurities may be N type impurities, such as phosphorus (P), P type impurities, such as boron (B), at least one of carbon (C), germanium (Ge), tin (Sn), and lead (Pb) or a combination of them.

If the first charge trap layers 23A are doped with the impurities as described above, the erase characteristic of the semiconductor device may be improved. For example, if a silicon nitride layer is doped with phosphorus (P), a deep donor level is formed about 1.4 eV below from a conduction band. Accordingly, a shallow trap level is formed, and thus the silicon nitride layer has the same characteristic as a Si-rich nitride layer. As a result, the semiconductor device may have an improved erase characteristic.

The channel layer 25 may have a central region fully filled or not. The case where the central region of the channel layer 25 is open and an insulating layer 26 is filled in the open central region is illustrated in the first embodiment.

The semiconductor device further includes a plurality of charge blocking layers 27 interposed between the plurality of word lines 21 and the plurality of first charge trap layers 23A. In particular, the semiconductor device may include a plurality of first charge blocking layers 27B surrounding second charge trap layers 23B and interposed between the plurality of second charge trap layers 23B and the plurality of interlayer insulating layers 22, respectively, and a plurality of second charge blocking layers 27A surrounding the plurality of word lines 21, respectively, and interposed between the word lines 21 and the interlayer insulating layer 22 and each between the word line 21 and the first charge trap layer 23A. Here, the first charge blocking layers 27B may be omitted, and only the second charge blocking layers 27A may be included.

The semiconductor device may further include the plurality of second charge trap layers 23B interposed between the plurality of interlayer insulating layers 22 and the tunnel insulating layer 24. In this case, charge trap layers 23 include the first charge trap layers 23A and the second charge trap layers 23B which are alternately arranged. The first charge trap layer 23A is used as a data depository included in the memory cell. Furthermore, the second charge trap layer 23B is placed between the stacked memory cells and configured to prevent electric charges, trapped in the first charge trap layer 23A, from moving to another first charge trap layer 23A.

For example, the first charge trap layers 23A may be doped with impurities, and the second charge trap layers 23B may not be doped with impurities. In this case, the semiconductor device may have an improved erase speed because the first charge trap layer 23A has the same characteristic as a Si-rich nitride layer. Furthermore, the semiconductor device may maintain data retention characteristic without change because the second charge trap layers 23B are not doped with the impurities.

For another example, the first charge trap layers 23A may be doped with a first type of impurities, and the second charge trap layers 23B may be doped with a second type of impurities different from the first type of impurities. In this case, the first charge trap layers 23A and the second charge trap layers 23B may play different roles because they have different characteristics. If the first charge trap layers 23A is doped with the N type impurities, such as phosphorus (P), and the second charge trap layers 23B is doped with the P type impurities, such as boron (B), an erase speed may be improved because the first charge trap layers 23A have the same characteristic as an Si-rich nitride layer and the semiconductor device may have an improved data retention characteristic because the second charge trap layers 23B prevent electric charges from moving.

FIG. 3 is a cross-sectional view illustrating the structure of a semiconductor device according to a second embodiment of the present invention. In FIG. 3, a region where memory cells are formed is enlarged and illustrated, for the illustrative purposes. Furthermore, a description of contents redundant with those of the previous embodiment is omitted for simplicity.

As shown in FIG. 3, the semiconductor device according to the second embodiment of the present invention may include charge trap layers 33 including nano-dots. In particular, the semiconductor device according to the second embodiment includes the charge trap layers 33 in each of which a first charge trap layer 33A, including nano-dots into which impurities have been injected, and a second charge trap layer 33B, including nano-dots into which impurities has not been injected, are arranged. In some embodiments, the first charge trap layers 33A and the second charge trap layers 33B may include nano-dots into which impurities having different types have been injected.

FIG. 4 is a cross-sectional view illustrating the structure of a semiconductor device according to a third embodiment of the present invention. In FIG. 4, a region where memory cells are formed is enlarged and illustrated, for description purposes.

As shown in FIG. 4, the semiconductor device according to the third embodiment of the present invention may include first charge trap layers 43A including nano-dots and second charge trap layers 43B not including nano-dots.

Figure 5:
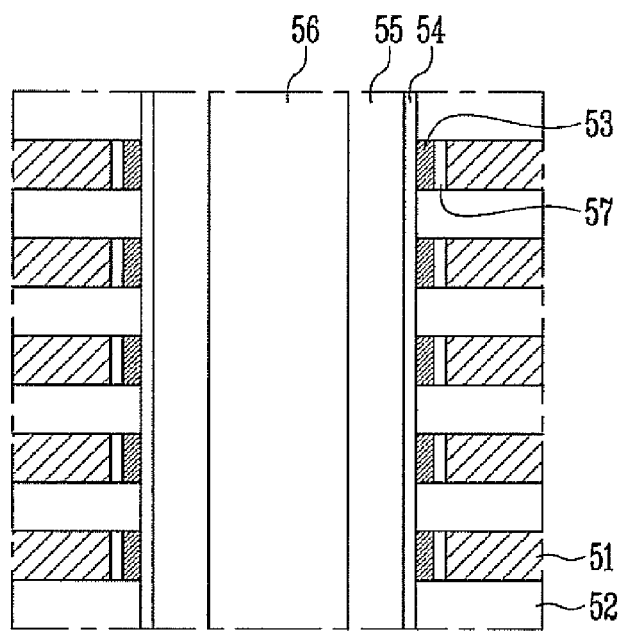
FIG. 5 is a cross-sectional view illustrating the structure of a semiconductor device according to a fourth embodiment of the present invention.

FIG. 5 is a cross-sectional view illustrating the structure of a semiconductor device according to a fourth embodiment of the present invention. In FIG. 5, a region where memory cells are formed is enlarged and illustrated, for description purposes.

As shown in FIG. 5, the semiconductor device according to the fourth embodiment of the present invention may include a plurality of first charge trap layers 53, and a plurality of charge blocking layers 57. The plurality of first charge trap layers 53 are interposed between respective word lines 51 and a tunnel insulating layer 54. The plurality of charge blocking layers 57 surround the first charge trap layers 53 and are interposed between the first charge trap layers 53 and the word lines 51, respectively. Although not shown in FIG. 5, the first charge trap layers 53 may include nano-dots into which impurities have been injected.

In this structure, the first charge trap layer 53 is included in each of the memory cells, but is not included between the memory cells. That is, the first charge trap layers 53 included in the stacked memory cells are physically separated from each other. Accordingly, the erase speed may be improved by injecting impurities into the first charge trap layers 53, and a data retention characteristic may also be improved because the first charge trap layers 53 are separated from each other.

Figure 6:
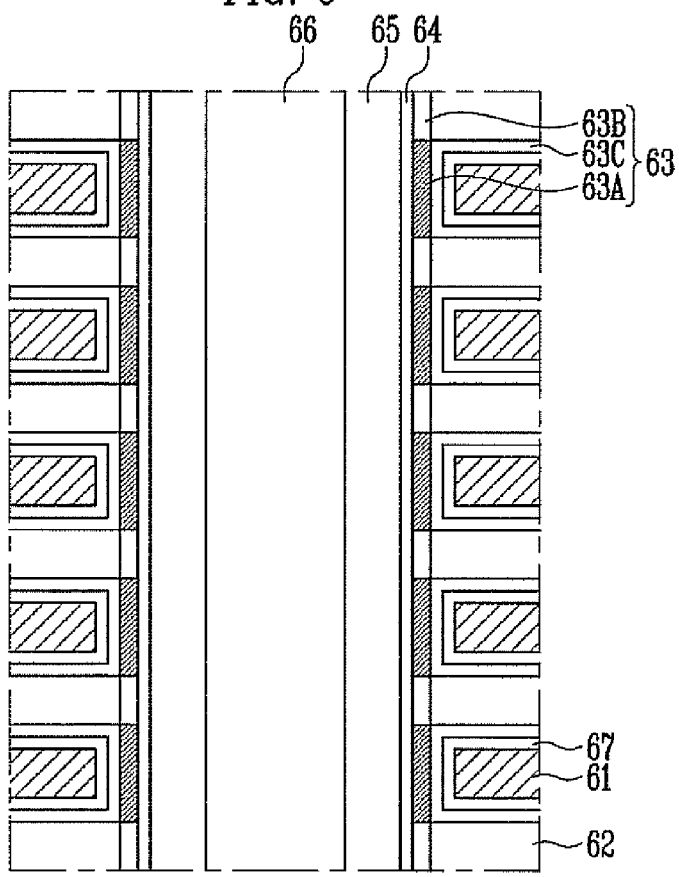
FIG. 6 is a cross-sectional view illustrating the structure of a semiconductor device according to a fifth embodiment of the present invention.

FIG. 6 is a cross-sectional view illustrating the structure of a semiconductor device according to a fifth embodiment of the present invention. In FIG. 6, a region where memory cells are formed is enlarged and illustrated, for description purposes.

As shown in FIG. 6, the semiconductor device according to the fifth embodiment of the present invention may further include third charge trap layers 63C each interposed between a first charge trap layer 63A and a charge blocking layer 67. Here, the third charge trap layer 63C is used as a kind of an auxiliary sub-charge trap layer for supplementing the first charge trap layer 63A. The third charge trap layer 63C may be made of stoichiometric nitride.

In this case, each of the memory cells has a stack structure, including the first charge trap layer 63A into which impurities have been injected and the third charge trap layer 63C made of stoichiometric nitride.

Here, impurities may not be not injected into the second charge trap layers 63B, or impurities having a different type from impurities injected into the first charge trap layers 63A may be injected into the second charge trap layers 63B. Furthermore, the first charge trap layers 63A may include nano-dots into which impurities have been injected.

Figure 7A:
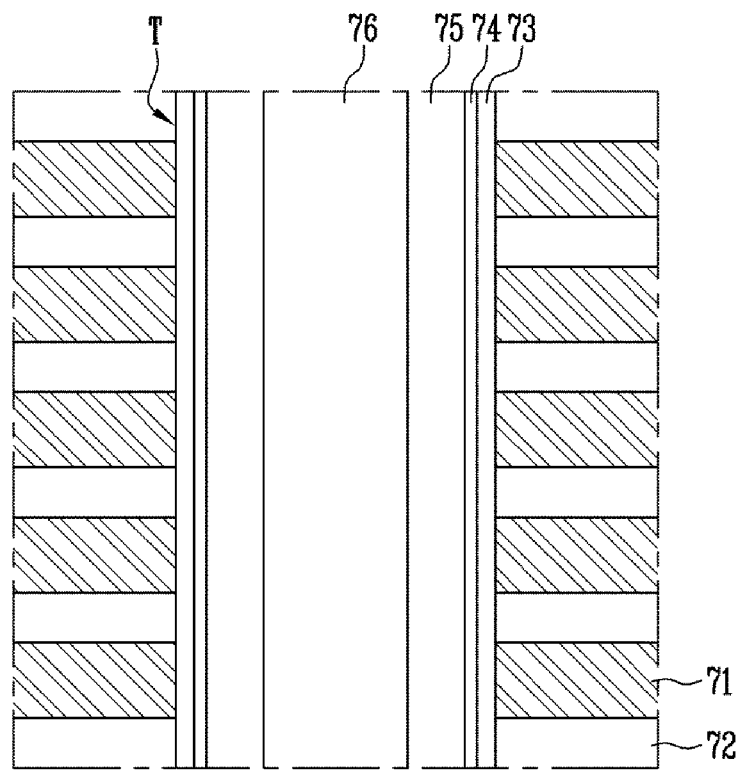
FIGS. 7A to 7C are cross-sectional views illustrating a method of manufacturing a semiconductor device according to a sixth embodiment of the present invention.
Figure 7B:
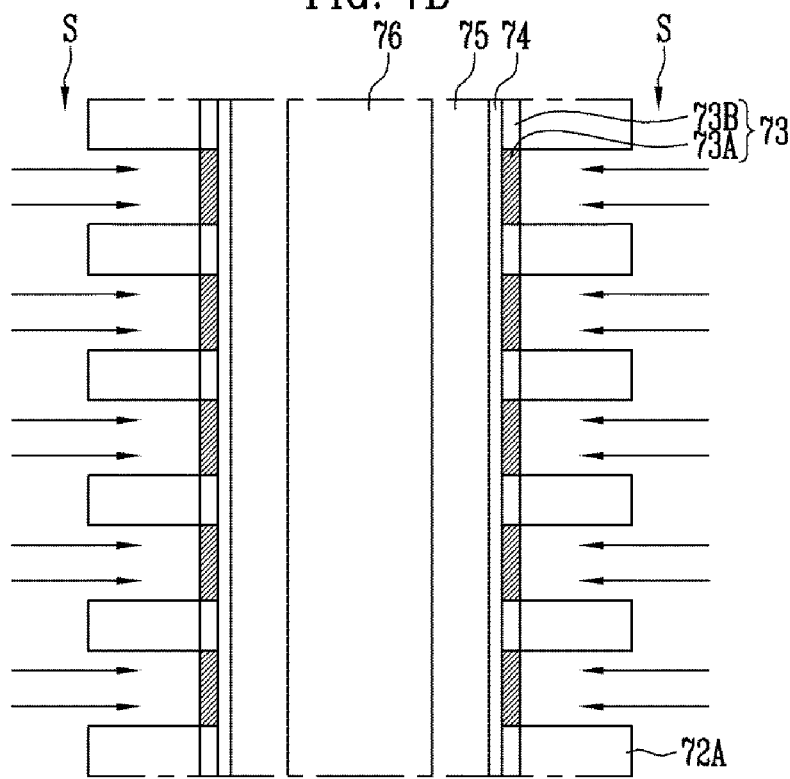
Figure 7C:
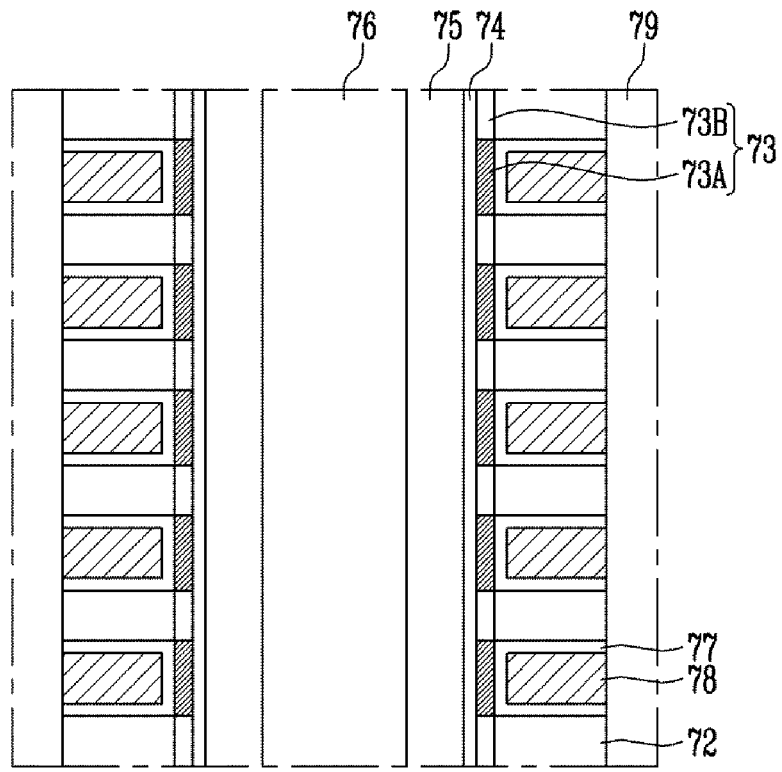

FIGS. 7A to 7C are cross-sectional views illustrating a method of manufacturing a semiconductor device according to a sixth embodiment of the present invention. In FIGS. 7A to 7C, a region where memory cells are formed is enlarged and illustrated, for description purposes.

As shown in FIG. 7A, a plurality of first material layers 71 and a plurality of second material layers 72 are alternately formed over a substrate (not shown) in which underlying structures are formed.

The first material layers 71 are used to form word lines in a subsequent process, and the second material layers 72 are used to form interlayer insulating layers each for separating the stacked word lines from each other. Accordingly, the number of each of the first material layers 71 and the second material layers 72 is determined by the number of memory cells to be stacked.

Materials for forming the first material layers 71 and the second material layers 72 are determined by taking the roles of the first and second material layers and processes of manufacturing the first and second material layers into consideration. The first material layers 71 and the second material layers 72 may be made of materials having a high etch selectivity. For example, the first material layer 71 may be formed of a conductive layer or a sacrificial layer for the word lines, and the second material layer 72 may be formed of an interlayer insulating layer or a sacrificial layer.

In the sixth embodiment, it is described that the first material layer 71 is formed of a sacrificial layer, such as a nitride layer, and the second material layer 72 is formed of an interlayer insulating layer, such as an oxide layer.

A trench T is formed by etching the plurality of first material layers 71 and the plurality of second material layers 72. A charge trap layer 73 is formed on the inner walls of the trenches T. The charge trap layer 73 may be formed of a material layer into which impurities have not been injected, such as an undoped silicon nitride layer or an undoped stoichiometric nitride.

Prior to the formation of the charge trap layer 73, a first charge blocking layer or a sacrificial layer (not shown) may be formed.

After forming a tunnel insulating layer 74 on the charge trap layer 73, a channel layer 75 is formed on the tunnel insulating layer 74. Here, the channel layer 75 may be formed so that the central region of the trench T is open or the trench T is fully filled. In FIG. 7A, the case where the central region of the trench T is open is illustrated. An insulating layer 76 is filled in the open central region of the trench T.

As shown in FIG. 7B, a slit S is formed by etching the plurality of first material layers 71 and the plurality of second material layers 72. The slit S is placed between adjacent trenches T. In this figure, the second material layers etched in the process of forming the slit S are denoted by reference numeral '72A'.

The plurality of first material layers 71 exposed by the slit S are recessed. Here, part of the charge trap layer is exposed through the regions from which the first material layers 71 are removed (hereinafter referred to as the recess regions). Hereinafter, parts of the charge trap layer 73, exposed through the recess regions, are called first charge trap layers 73A, and other parts of the charge trap layer 73, not exposed through the recess regions, are called second charge trap layers 73B.

Meanwhile, if a first charge blocking layer is formed before forming the charge trap layer 73 as described above, the first charge blocking layer is exposed through the recess regions. In this case, prior to a subsequent impurity doping process, the first charge blocking layer is etched to expose the charge trap layer 73. Thus, the first charge blocking layers (refer to 27B in FIG. 2) interposed between the interlayer insulating layers 72 and the second charge trap layers 73B, respectively, may be formed. If a sacrificial layer is formed before forming the charge trap layer 73, the charge trap layer 73 may be prevented from being exposed and damaged in the process of recessing the first material layers 71.

Next, impurities are injected into the first charge trap layers 73A exposed through the recess regions. For example, the impurities may be injected into the first charge trap layers 73A by performing a thermal treatment process under an atmosphere including a dopant gas. In some embodiments, the impurities may be injected into the first charge trap layers 73A to be within a whole thickness or some thickness from a surface thereof by controlling impurities injecting condition. If the impurities are injected into the first charge trap layers 73A to be within some thickness from a surface thereof, the first charge trap layer 73A may have a stack structure, including a charge trap layer undoped with the impurities and a charge trap layer doped with the impurities.

Since the impurities are injected into the first charge trap layers 73A only as described above, the charge trap layer 73 in which the first charge trap layers 73A doped with the impurities and the second charge trap layers 73B undoped with the impurities are alternately arranged is finally formed.

As shown in FIG. 7C, a second charge blocking layer 77 is formed on the inside of each of the recess regions. A third charge trap layer (not shown) may be further formed before forming the second charge blocking layers 77. For example, if the third charge trap layer is formed of a stoichiometric nitride layer, the charge trap layer having a stack structure, including the stoichiometric nitride layer and a nitride layer into which impurities have been injected, or a stack structure, including the stoichiometric nitride layer, a nitride layer into which impurities have been injected, and the stoichiometric nitride layer, may be finally formed.

Next, a plurality of word lines 78 are formed by filling a conductive layer within the recess regions in which the second charge blocking layers 77 are formed. The conductive layer may be a metal layer made of tungsten (W). In some embodiments, the word lines 78 may be formed by repeating a process of depositing and etching the conductive layer several times.

Next, an insulating layer 79 is filled within the slits S. In some embodiments, the insulating layer may not be filled within the slits S, and an air gap may be formed between the word lines 78 by forming the insulating layer only in the open parts of the slits S.

Accordingly, the plurality of memory cells including the charge trap layer 73 in which the first charge trap layers 73A doped with the impurities and the second charge trap layers 73A undoped with impurities are alternately arranged and stacked along the channel layer 75 are formed.

Meanwhile, in the sixth embodiment, the case where the impurities are injected into only the first charge trap layers 73A after forming the charge trap layer 73 undoped with impurities has been described, but the present invention is not limited to the case.

For example, after forming the charge trap layer 73 doped with impurities of a first type (for example, a P type), such as doped silicon nitride or doped stoichiometric nitride, impurities of a second type (for example, an N type) may be injected into the first charge trap layers 73A exposed through the recess regions.

In this case, a concentration of the impurities of the second type may be higher than a concentration of the impurities of the first type injected into the first charge trap layers 73A. If, as described above, the impurities of the second type are over injected, the charge trap layer 73 in which the first charge trap layers 73A doped with the impurities of the second type and the second charge trap layers 73B doped with the impurities of the first type are alternately arranged is finally formed.

In some embodiments, the impurities of the second type may be injected to the extent such that a concentration of the impurities of the second type may offset a concentration of the impurities of the first type that have been injected into the first charge trap layers 73A. In this case, the charge trap layer 73 in which the first charge trap layers 73A undoped with impurities and the second charge trap layers 73B doped with the impurities of the first type are alternately arranged is finally formed.

Figure 8A:
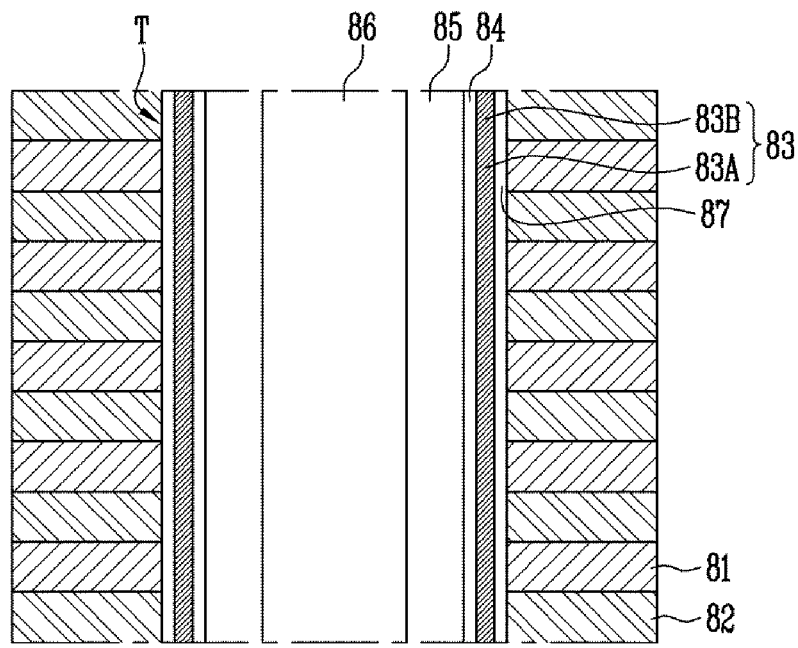
FIGS. 8A to 8C are cross-sectional views illustrating a method of manufacturing a semiconductor device according to a seventh embodiment of the present invention.
Figure 8B:
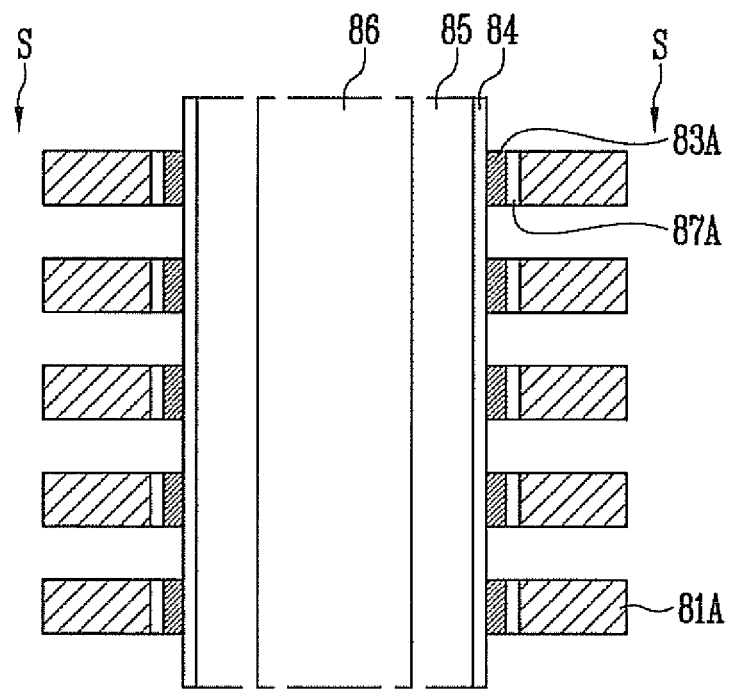
Figure 8C:
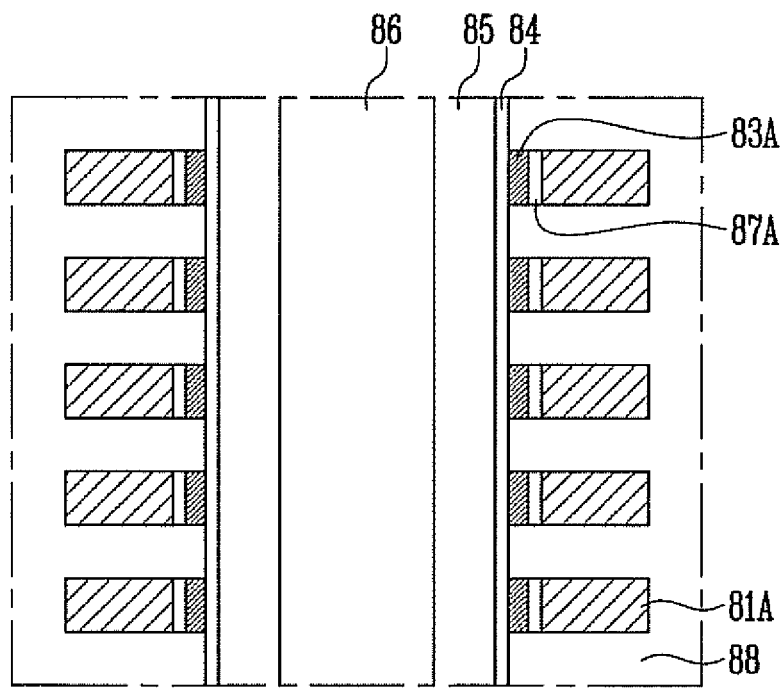

FIGS. 8A to 8C are cross-sectional views illustrating a method of manufacturing a semiconductor device according to a seventh embodiment of the present invention. In FIGS. 8A to 8C, a region where memory cells are formed is enlarged and illustrated, for description purposes. Furthermore, a description of contents redundant with those of the previous embodiments is omitted for simplicity.

As shown in FIG. 8A, a plurality of first material layers 81 and a plurality of second material layers 82 are alternately formed over a substrate (not shown) in which underlying structures are formed.

In the seventh embodiment, it is described that the first material layer 81 is formed of a conductive layer for a word line, such as a doped polysilicon layer or a doped amorphous silicon layer, and the second material layer 82 is formed of a sacrificial layer, such as an undoped polysilicon layer or an undoped amorphous silicon layer. Here, the term 'doped' means that a dopant, such as boron (B), has been injected, and the term 'undoped' means that any dopant has not been injected.

A trench T is formed by etching the plurality of first material layers 81 and the plurality of second material layers 82. A charge blocking layer 87 is formed on the inner walls of the trenches T.

A charge trap layer 83 doped with impurities is formed on the charge blocking layer 87. For example, the charge trap layer 83 may be formed of a material layer doped with impurities, such as a doped silicon nitride layer or a doped stoichiometric nitride layer. As described above, the charge trap layer 83 includes first charge trap layers 83A and second charge trap layers 83B which are alternately arranged.

After forming a tunnel insulating layer 84 on the charge trap layer 83, a channel layer 85 is formed on the tunnel insulating layer 84. Here, if the channel layer 85 is formed so that the central region of the trench T is open, an insulating layer 86 is filled within the open central region.

As shown in FIG. 8B, a slit S placed between adjacent trenches T is formed by etching the plurality of first material layers 81 and the plurality of second material layers 82. In this figure, the first material layers etched in the process of forming the slits S are denoted by reference numerals '81A'.

The plurality of second material layers 82 exposed by the slits S are recessed. The charge blocking layer 87 is exposed through the regions from which the second material layers 82 are removed (hereinafter referred to as the recess regions).

First charge blocking layers 87A each interposed between the first charge trap layer 83A and the word line 81A are formed by etching the charge blocking layer 87 exposed through the recess regions. The second charge trap layers 83B are also exposed when etching the charge blocking layer 87.

The second charge trap layers 83B exposed through the recess regions are removed so that only the first charge trap layers 83A remain intact.

For example, the second charge trap layers 83B exposed through the recess regions may be removed by etching. In this case, the second charge trap layers 83B may be removed by an etch process so that only the first charge trap layers 83A remain intact.

For another example, the second charge trap layers 83B exposed through the recess regions may be removed by oxidization. If the charge trap layer formed of a nitride layer is oxidized, the oxidized layer does not function as a charge trap layer because the characteristics of material forming the charge trap layer is changed. Accordingly, although the second charge trap layers 83B that has been oxidized remain, it does not function as a charge trap layer, and thus only the first charge trap layers 83A substantially remain.

Accordingly, the plurality of first charge trap layers 83A disposed between the respective word lines 81A and the tunnel insulating layer 84 and doped with the impurities are finally formed.

As shown in FIG. 8C, an insulating layer 88 is filled within the recess regions and the slits S. In order to improve a gap-fill characteristic, the insulating layer 88 may be filled by repeating deposition and etch processes several times. Furthermore, the first material layers 81A exposed by the slits S may be silicided in order to reduce resistance of the word lines 81A. In some embodiments, the insulating layer may not be filled within the slits S, and an air gap may be formed between the word lines 81A by forming the insulating layer only in the open parts of the slits S.

Accordingly, the plurality of memory cells including the plurality of first charge trap layers 83, doped with the impurities and placed between the plurality of word lines and the tunnel insulating layer 84, and stacked along the channel layer 85 are formed.

In the seventh embodiment, the case where the second charge trap layers 83B are removed has been described, but the present invention is not limited to the case.

For example, after forming the charge trap layers 83 doped with impurities of a first type (for example, an N type), such as doped silicon nitride or doped stoichiometric nitride, impurities of a second type (for example, a P type) may be injected into the second charge trap layers 83B exposed through the recess regions.

For example, the impurities of the second type may be injected to the extent such that a concentration of the impurities of the second type may offset a concentration of the impurities of the first type that have been injected into the second charge trap layers 83B. In this case, the charge trap layer 83 in which the first charge trap layers 83A doped with the impurities of the first type and the second charge trap layers 83B undoped with impurities are alternately arranged is finally formed.

For another example, a concentration of the impurities of the second type may be higher than a concentration of the impurities of the first type that have been injected into the second charge trap layers 83B. If, as described above, the impurities of the second type are over injected, the charge trap layer 83 in which the first charge trap layers 83A doped with the impurities of the first type and the second charge trap layers 83B doped with the impurities of the second type are alternately arranged is finally formed.

Figure 9A:
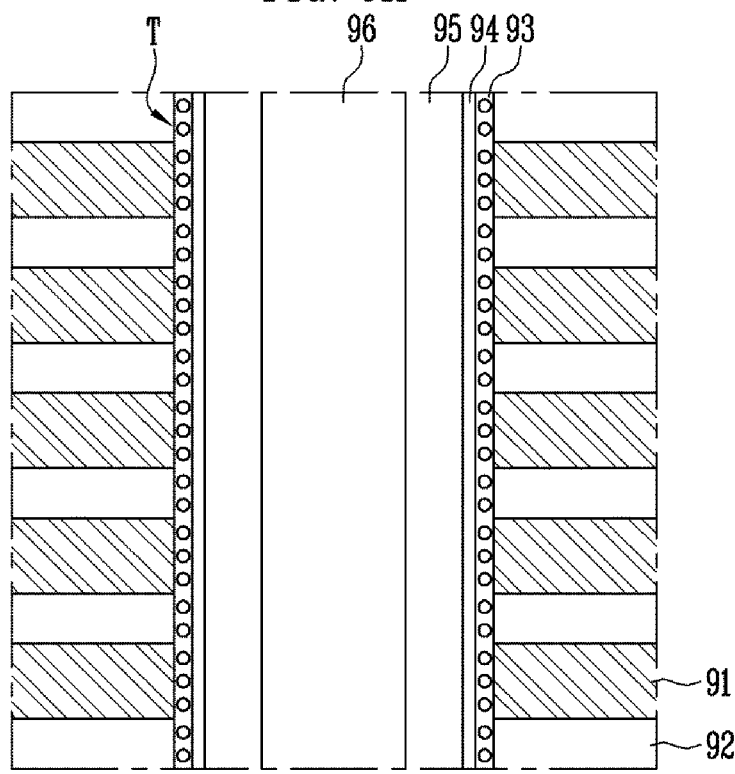
FIGS. 9A to 9C are cross-sectional views illustrating a method of manufacturing a semiconductor device according to an eighth embodiment of the present invention.
Figure 9B:
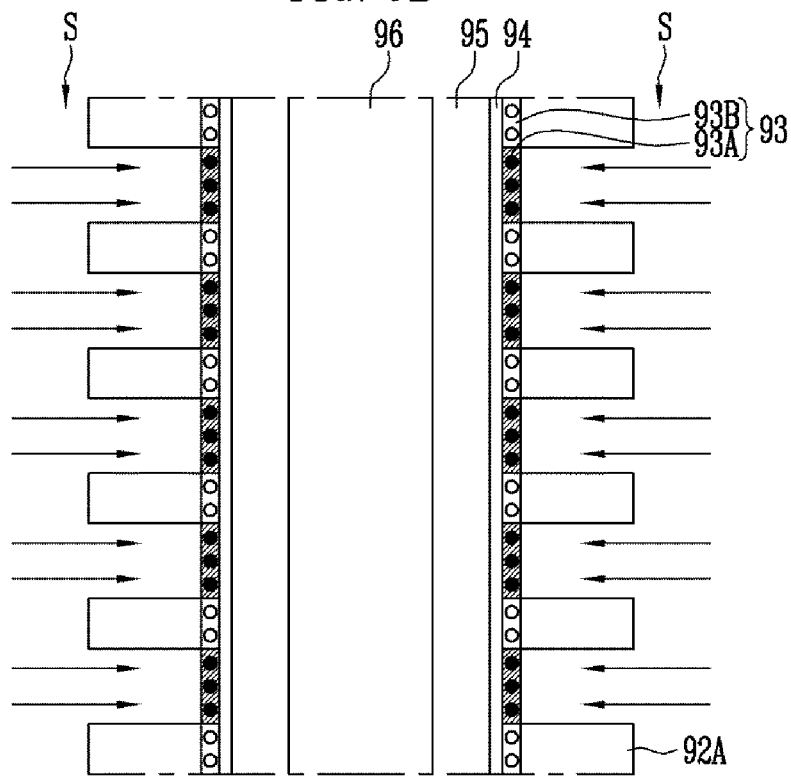
Figure 9C:
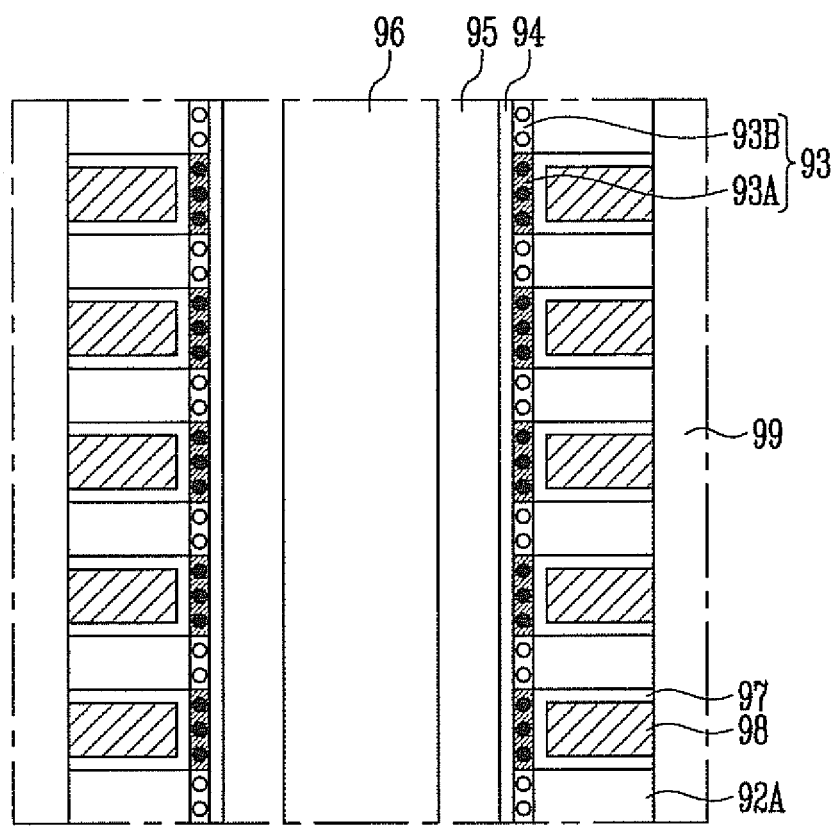

FIGS. 9A to 9C are cross-sectional views illustrating a method of manufacturing a semiconductor device according to an eighth embodiment of the present invention. In FIGS. 9A to 9C, a region where memory cells are formed is enlarged and illustrated, for description purposes.

As shown in FIG. 9A, a plurality of first material layers 91 and a plurality of second material layers 92 are alternately formed over a substrate (not shown) in which underlying structures are formed.

In the eighth embodiment, it is described that the first material layer 91 is formed of a sacrificial layer, such as a nitride layer, and the second material layer 92 is formed of an interlayer insulating layer, such as an oxide layer.

A trench T is formed by etching the plurality of first material layers 91 and the plurality of second material layers 92. A charge trap layer 93 is formed on the inner walls of the trenches T. The charge trap layer 93 may be formed to include nano-dots undoped with impurities.

After forming a tunnel insulating layer 94 on the charge trap layer 93, a channel layer 95 is formed on the tunnel insulating layer 94. If the central region of the channel layer 95 is open, an insulating layer 96 is filled in the open central region.

As shown in FIG. 9B, a slit S placed between adjacent trenches T is formed by etching the plurality of first material layers 91 and the plurality of second material layers 92. In this figure, the second material layers etched in the process of forming the slits S are denoted by reference numerals '92A'.

The plurality of first material layers 91 exposed by the slits are recessed. First charge trap layers 93A are exposed through the regions from which the first material layers 91 are removed (hereinafter referred to as the recess regions).

Impurities are injected into the first charge trap layers 93A exposed through the recess regions. Thus, the impurities are injected into the nano-dots included in the first charge trap layers 93A, so that the charge trap layer 93 in which the first charge trap layers 93A, including the nano-dots doped with the impurities, and second charge trap layers 93B, including the nano-dots undoped with impurities, are alternately arranged is finally formed.

As shown in FIG. 9C, a charge blocking layer 97 is formed on the insides of the recess regions. A third charge trap layer (not shown) may be formed before forming the charge blocking layer 97.

A plurality of word lines 98 are formed by filling a conductive layer in the recess regions in which the respective charge blocking layers 97 are formed. The conductive layer may be a metal layer made of tungsten (W).

Next, an insulating layer 99 is filled within the slits S. In some embodiments, the insulating layer is not filled within the slits S, and an air gap may be formed between the word lines 98 by forming the insulating layer only in the open parts of the slits S.

Thus, the plurality of memory cells including the charge trap layer 93 in which the first charge trap layers 93A, including the nano-dots doped with the impurities, and the second charge trap layers 93A, including the nano-dots undoped with impurities, are alternately arranged and stacked along the channel layer 95 are formed.

The case where the nano-dots have been applied to the sixth embodiment has been described in connection with the eighth embodiment, but the present invention is not limited to the case. For example, the nano-dots may also be applied to the seventh embodiment. If the nano-dots are applied to the seventh embodiment, a charge trap layer including nano-dots into which impurities have been injected is formed.

Furthermore, the case where the impurities are injected into only the first charge trap layers 93A after forming the charge trap layer 93 including the nano-dots has been described in connection with the eighth embodiment, but the present invention is not limited to the case.

For example, after forming the charge trap layer 93 not including nano-dots, impurities may be injected into the first charge trap layers 93A exposed through the recess regions and nano-dots may be included only in the first charge trap layers 93A by using the injected impurities as a seed.

Figure 10:
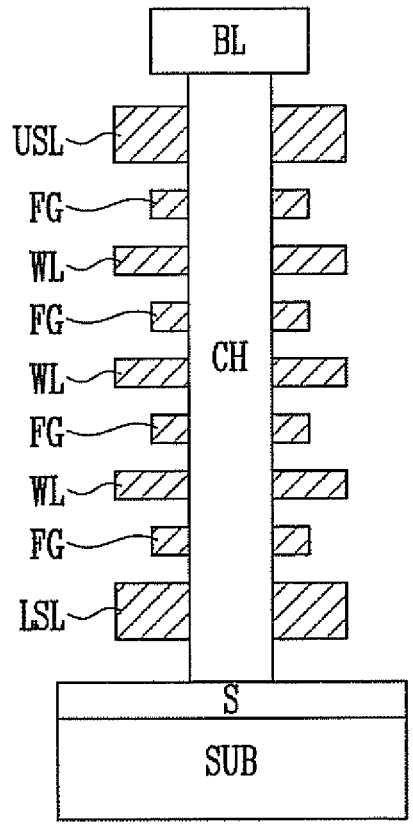
FIG. 10 is a cross-sectional view illustrating the structure of a nonvolatile memory device to which memory cells according to the first to eighth embodiments of the present invention are applied.

FIG. 10 is a cross-sectional view illustrating the structure of a nonvolatile memory device to which the memory cells according to the first to eighth embodiments of the present invention are applied. In this figure, gate lines are chiefly illustrated and the remaining layers are not shown, for convenience of description.

As shown in FIG. 10, the nonvolatile memory device according to an exemplary embodiment of the present invention includes a channel layer CH protruding from a substrate SUB including a source region S and a plurality of memory cells FG stacked along the channel layer CH. Particularly, the nonvolatile memory device further includes a lower selection line LSL, a plurality of word lines WL, and an upper selection line USL all of which are sequentially stacked over the substrate SUB.

In this structure, cell strings are arranged vertically to the substrate SUB, and each of the memory cells FG may have one of the structures according to the first to eighth embodiments or a combination of them.

Figure 11:
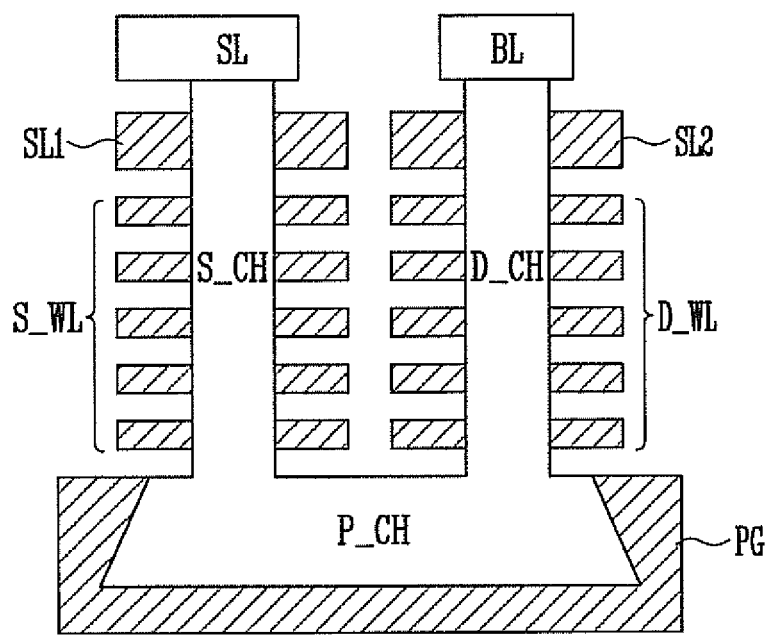
FIG. 11 is a cross-sectional view illustrating the structure of a nonvolatile memory device to which the memory cells according to the first to eighth embodiments of the present invention are applied.

FIG. 11 is a cross-sectional view illustrating the structure of a nonvolatile memory device to which the memory cells according to the first to eighth embodiments of the present invention are applied. In FIG. 11, gate lines are chiefly illustrated and the remaining layers are not shown, for description purposes.

As shown in FIG. 11, the nonvolatile memory device according to an embodiment of the present invention includes a pipe gate PG, a plurality of source-side word lines S_WL and a plurality of drain-side word lines D_WL stacked over the pipe gate PG, a first selection line SL1 formed over the source-side word lines S_WL, and a second selection line SL2 formed over the drain-side word lines D_WL. The nonvolatile memory device further includes a pipe channel layer P_CH formed within the pipe gate PG and a channel layer including a pair of a source-side channel layer S_CH and a drain-side channel layer D_CH coupled to the pipe channel layer P_CH. The source-side channel layer S_CH is formed to protrude from a substrate and penetrate the plurality of source-side word lines S_WL. The drain-side channel layer D_CH is formed to protrude from a substrate and penetrate the plurality of drain-side word lines D_WL.

In this structure, cell strings are arranged over the substrate in a U form, and each of the memory cells may have one of the structures according to the first to eighth embodiments or a combination of them.

Figure 12:
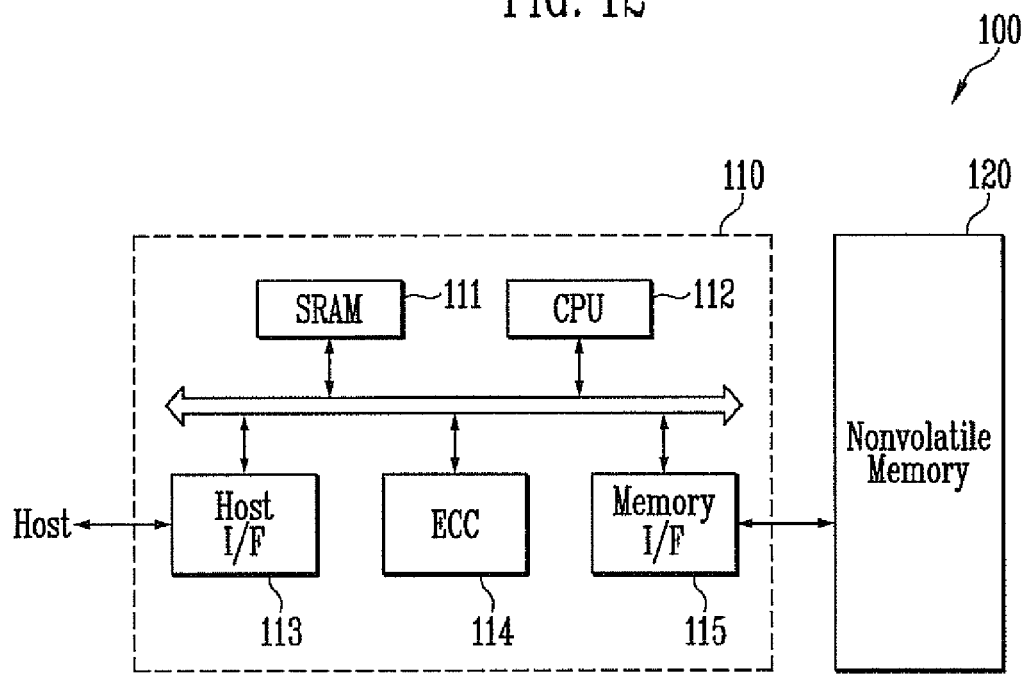
FIG. 12 shows the construction of a memory system according to an exemplary embodiment of the present invention.

FIG. 12 shows the construction of a memory system according to an exemplary embodiment the present invention.

As shown in FIG. 12, the memory system 100 according to the exemplary embodiment of the present invention includes a nonvolatile memory device 120 and a memory controller 110.

The memory controller 110 is configured to control the nonvolatile memory device 120, and it may include SRAM 111, a Central Processing Unit (CPU) 112, a host interface (I/F) 113, an ECC circuit 114, and a memory interface (I/F) 115. The SRAM 111 is used as the operating memory of the CPU 112. The CPU 112 performs an overall control operation for the data exchange of the memory controller 110. The host I/F 113 is equipped with the data exchange protocol of a host that accesses the memory system 100. Furthermore, the ECC 114 circuit detects and corrects errors included in data read from the nonvolatile memory device 120. The memory I/F 115 interfaces with the nonvolatile memory device 120. The memory controller 110 may further include RCM for storing code data for an interface with the host.

The memory system 100 configured as described above may be a memory card or a Solid State Disk (SSD) in which the nonvolatile memory device 120 and the controller 110 are combined. For example, if the memory system 100 is an SSD, the memory controller 110 may communicate with the outside (for example, a host) through one of various interface protocols, such as USB, MMC, PCI-E, SATA, PATA, SCSI, ESDI, and IDE.

Figure 13:
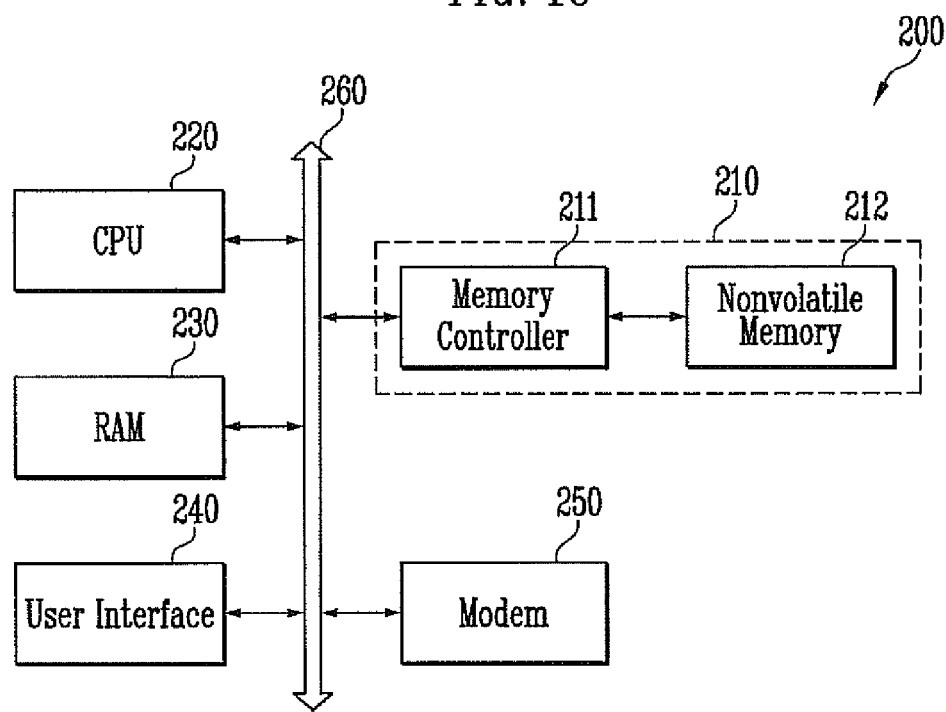
FIG. 13 shows the construction of a computing system according to an exemplary embodiment of the present invention.

FIG. 13 shows the construction of a computing system according to an exemplary embodiment of the present invention.

As shown in FIG. 13, the computing system 200 according to the exemplary embodiment of the present invention may include a CPU 220, RAM 230, a user interface 240, a modem 250, and a memory system 210 all of which are electrically coupled to a system bus 260. If the computing system 200 is a mobile device, it may further include a battery for supplying operating voltages to the computing system 200. The computing system 200 may further include application chipsets, a Camera Image Processor (CIS), mobile DRAM, and so on.

The memory system 210 may include a nonvolatile memory device 212 and a memory controller 211, such as those described above with reference to FIG. 12.

What is claimed is:

1. A method of manufacturing a semiconductor device, comprising:
    alternately forming first material layers and second material layers;
    forming at least one channel layer penetrating the first material layers and the second material layers, and a charge trap layer surrounding the channel layer;
    forming a slit passing through the first material layers and the second material layers;
    forming recess regions exposing first regions of the charge trap layer by removing the first material layers exposed by the slits;
    injecting first impurities into the first regions of the charge trap layer through the recess regions; and
    forming word lines in the recess regions.

2. The method of claim 1, wherein the charge trap layer is formed of a nitride layer undoped with impurities.

3. The method of claim 2, after injecting the first impurities, the charge trap layer includes first regions doped with the first impurities and the second regions arranged between the first regions and undoped with impurities.

4. The method of claim 1, wherein the charge trap layer is formed of a nitride layer doped with second impurities which is a different type from the first impurities.

5. The method of claim 1, wherein the charge trap layer is formed of a nitride layer comprising nano-dots.

6. The method of claim 1, further comprising:
    forming nano-dots within the charge trap layer by using the first impurities as a seed after the injecting of the first impurities into the first regions of the charge trap layer.

7. The method of claim 1, further comprising:
    forming a sub-charge trap layer on inner sides of the recess regions, before the forming of the word line in the regions.

8. The method of claim 1, further comprising:
    forming a charge blocking layer on inner sides of the recess regions, before the forming of the word line in the regions.

9. The method of claim 1, wherein the forming of the channel layer and the charge trap layer comprises:
    forming a trench by etching the first material layers and the second material layers;
    forming the charge trap layer on inner walls of the trench;
    forming a tunnel insulating layer on the charge trap layer; and
    forming the channel layer on the tunnel insulating layer.

10. The method of claim 9, further comprising:
   forming a first charge blocking layer on the inner walls of the trench before the forming of the charge trap layer; and
   etching the first charge blocking layer exposed through the recess regions before the injecting of the first impurities; and
   forming a second charge blocking layer on insides of the recess regions, after doping the first impurities.

11. A method of manufacturing a semiconductor device, comprising:
   alternately Raining conductive layers and sacrificial layers;
   forming at least one channel layer penetrating the conductive layers and the sacrificial layers, a charge trap layer surrounding the channel layer and doped with first impurities, and a charge blocking layer surrounding the charge trap layer;
   forming a slit exposing the sacrificial layers by etching the conductive layers and the sacrificial layers;
   removing the sacrificial layers exposed by the slits;
   etching the charge blocking layer exposed by removing the sacrificial layers;
   removing the charge trap layer exposed by etching the charge blocking layer; and
   forming an inter-layer insulating layer in regions from which the sacrificial layers, the charge blocking layer, and the charge trap layer are removed.

12. The method of claim 11, wherein the removing of the charge trap layer comprises etching the exposed charge trap layer.

13. The method of claim 11, wherein the removing of the charge trap layer comprises oxidizing the exposed charge trap layer.

14. The method of claim 11, wherein the charge trap layer is formed of a nitride layer comprising nano-dots.

15. The method of claim 11, wherein the forming of the channel layer, the charge trap layer, and the charge blocking layer comprises:
   forming a trench by etching the conductive layers and the sacrificial layers;
   forming the charge blocking layer on inner walls of the trench;
   forming the charge trap layer doped with the first impurities on the charge blocking layer;
   forming a tunnel insulating layer on the charge trap layer; and
   forming the channel layer on the tunnel insulating layer.

16. A method of manufacturing a semiconductor device, comprising:
   alternately forming first material layers and second material layers;
   forming at least one channel layer penetrating the first material layers and the second material layers, and a charge trap layer surrounding the channel layer;
   forming a slit passing through the first material layers and the second material layers;
   forming recess regions exposing first regions of the charge trap layer by removing the first material layers exposed by the slits;
   injecting first impurities into the first regions of the charge trap layer through the recess regions; and
   forming interlayer insulating layers in the recess regions.

17. The method of claim 16, wherein a concentration of the first impurities injected into the first regions is higher than a concentration of second impurities included in the charge trap layers when the charge trap layers are formed.

18. The method of claim 17, after the injecting of the first impurities, the charge trap layer includes first regions doped with the first impurities and second regions arranged between the first regions and doped with the second impurities.

19. The method of claim 16, wherein the first impurities injected into the first regions offset the second impurities included in the charge trap layers when the charge trap layers are formed.

20. The method of claim 19, after injecting the first impurities, the charge trap layer includes first regions undoped with impurities and the second regions arranged between the first regions and doped with the second impurities.

* * * * *